(12) United States Patent
Figuet

(10) Patent No.: US 7,387,953 B2
(45) Date of Patent: Jun. 17, 2008

(54) LAMINATED LAYER STRUCTURE AND METHOD FOR FORMING THE SAME

(75) Inventor: Christophe Figuet, Crolles (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 366 days.

(21) Appl. No.: 11/146,572

(22) Filed: Jun. 6, 2005

(65) Prior Publication Data

US 2006/0211230 A1   Sep. 21, 2006

(30) Foreign Application Priority Data

Mar. 21, 2005   (EP)   ................... 05290622

(51) Int. Cl.
*H01L 21/00* (2006.01)
(52) U.S. Cl. .................. 438/478; 438/590; 438/763; 257/19; 257/E21.615
(58) Field of Classification Search ........... 438/478, 438/479, 481, 590, 761, 763, 933, 938; 257/15, 257/18, 19
See application file for complete search history.

(56) References Cited

U.S. PATENT DOCUMENTS

| 5,442,205 | A | 8/1995 | Brasen et al. | |
|---|---|---|---|---|
| 6,525,338 | B2 | 2/2003 | Mizushima et al. | |
| 7,129,488 | B2 * | 10/2006 | Lee et al. | 250/338.4 |
| 2003/0153161 | A1 | 8/2003 | Chu et al. | 438/455 |
| 2004/0087117 | A1 | 5/2004 | Leitz et al. | 438/492 |

FOREIGN PATENT DOCUMENTS

WO   WO 03/103031 A2   12/2003

OTHER PUBLICATIONS

J. Tersoff; Dislocations and strain relief in compositionally graded layers; Appl. Phys. Lett. 62 (7), Feb. 15, 1993, pp. 693-695.
D. Dunstan et al.; Plastic relaxation of metamorphic single layer and multilayer InGaAs/GaAs structures; Appl. Phys. Lett. 65 (7), Aug. 15, 1994, pp. 839-841.

(Continued)

*Primary Examiner*—Michael S. Lebentritt
*Assistant Examiner*—Reema Patel
(74) *Attorney, Agent, or Firm*—Winston & Strawn LLP

(57) ABSTRACT

The invention relates to a laminated layer structure that includes a substrate and a stack of a plurality of layers of a material that includes at least two compounds A and B, wherein compound A has a crystalline structure being sufficient to allow a homo- or heteroepitaxial growth of compound A on the substrate, and wherein at least a part of the layers of the stack have a gradient composition $A_xB_{(1-xg)}$, with x being a composition parameter within the range of 0 and 1 and with the composition parameter $(1-x_g)$ increasing gradually, in particular linearly, over the thickness of the corresponding layer. In order to improve the quality of the laminated layer structure with respect to the surface roughness and dislocation density, the composition parameter at the interface between the layer in the stack with the gradient composition and the subsequent layer in the stack is chosen to be smaller than the composition parameter $(1-x_g)$ of the layer with a gradient composition. The invention also relates to a method to fabricate such a laminated layer structure.

20 Claims, 1 Drawing Sheet

OTHER PUBLICATIONS

E. Fitzgerald, et al.; Relaxed $Ge_xSi_{1-x}$ structures for III-V integration with Si and high mobility two-dimensional electron gases in Si; J. Vac. Sci. Technol. B. vol. 10 (4), Jul./Aug. 1992, pp. 1807-1819.

F. Schäffler; High-mobility Si and Ge structures; Semicond. Sci. Technol. 12 (1997) 1515-1549.

* cited by examiner

LAMINATED LAYER STRUCTURE AND METHOD FOR FORMING THE SAME

BACKGROUND ART

The invention relates to a laminated layer structure comprising a substrate, and a stack of a plurality of layers of a material comprising at least two compounds A and B in the layers wherein compound A has a lattice parameter being sufficient to allow a homo- or heteroepitaxial growth of compound A on the substrate, and wherein at least a part of the layers of the stack has a grading composition $A_{xg}B_{(1-xg)}$, with x being a composition parameter within the range of 0 and 1 and with the composition parameter $(1-x_g)$ increasing gradually, in particular linearly, over the thickness of the corresponding layer. The invention also relates to a method for forming such a laminated layer structure.

This type of laminated structure is generally known from U.S. Pat. No. 6,525,338 where it is used as a starting material for obtaining a strained silicon substrate. Strained silicon substrates find their use in high-speed microelectronic devices. The strained silicon technology takes advantage of the tendency for atoms inside compounds to align with one another. Silicon is deposited on top of a substrate, the atoms of which are spaced farther apart than compared to the ones of silicon. To adapt to the structure of the substrate the atoms in the silicon layer will stretch to line up with the atoms beneath, thereby straining the silicon. In the strained silicon layer, the electrons experience less resistance to movement and this leads to an increase in speed in the microelectronic chips fabricated with strained silicon substrates.

Conventionally strained silicon is achieved by epitaxially growing silicon (Si) on a $Si_xGe_{1-x}$ layer that has a larger lattice constant, which itself has been epitaxially deposited on a Si substrate. Due to the difference in lattice parameters in the different layers, crystalline defaults, like dislocations and high surface roughness, are created, thereby limiting the crystalline quality of the strained silicon layer. These defaults limit the applicability of the strained silicon substrates. To overcome this problem, U.S. Pat. No. 6,525,338 proposes to provide a silicon germanium buffer layer on a starting silicon substrate, wherein the buffer layer is constructed out of a plurality of laminated layers comprising alternating layers of a silicon germanium gradient composition, in which the germanium composition increases gradually from the composition of the base material, and a silicon germanium constant composition layer provided on top of the gradient composition layer, in which the germanium composition ratio is equal to the one of the upper surface of the gradient composition layer. By providing alternating layers, an improved strained silicon layer was achieved with a surface roughness reduced down to 16 Å RMS and a dislocation density of $3.5 \times 10^5$ cm$^{-2}$.

With the ever-increasing necessity of improved semiconductor substrates for the microelectronic industry, however, the achieved quality improvements of the strained silicon substrate according to U.S. Pat. No. 6,525,338 are not sufficient. There is therefore a need to improve such laminated layer structures to further reduce the surface roughness and the dislocation density.

SUMMARY OF THE INVENTION

The present invention relates to a laminated layer structure comprising a substrate, a stack of a plurality of layers provided upon the substrate and comprising a material having at least two compounds A and B, wherein compound A has a lattice parameter that is sufficient to allow homo- or heteroepitaxial growth of compound A on the substrate. Advantageously, at least a part of the stack of layers has a gradient composition $A_{xg}B_{(1-xg)}$, with xg being a composition parameter of A that is within the range of 0 and 1, and with (1-xg) being a composition parameter of B that increases gradually over the thickness of that part of the layer. Additionally, a subsequent layer in the stack positioned adjacent the part of the stack having gradient composition $A_{xg}B_{(1-xg)}$ at an interface therewith, with the subsequent layer having a composition of $A_{xs}B_{(1-xs)}$ with xs being a composition parameter of A and (1-xs) being a composition parameter of B wherein the parameter (1-xs) is smaller than the parameter (1-xg).

Preferably, the layers in the stack that have the gradient composition alternate with layers having a constant composition (1-xc), and at the interface the composition parameter (1-xc) is essentially the same as the composition parameter (1-xg) and wherein in other alternate layers the composition parameter (1-xc) is essentially the same as or less than the composition parameter (1-xg) of adjacent layers having the gradient composition.

The invention also relates to a method forming a laminated layer structure which comprises providing a substrate, growing a layer of a material comprising at least two compounds $A_x$ and $B_{(1-x)}$ with a gradient composition $A_{xg}B_{(1-xg)}$, such that the composition parameter (1-xg) gradually increases over the thickness of the layer, growing a subsequent layer of a material $A_{xs}B_{(1-xs)}$ on the layer of a material $A_xB_{(1-x)}$ having a gradient composition $A_{xg}B_{(1-xg)}$, and repeating the two preceding steps a predetermined number of times to build a stack of layers of the material $A_xB_{(1-x)}$. Advantageously, compound A has a lattice parameter being sufficient to allow homo- or heteroepitaxial growth of compound A on the substrate, and x is a composition parameter within the range of 0 to 1 The method also comprises choosing growth parameters at an interface between a layer having a gradient composition and a subsequent layer such that the composition parameter (1-xs) of the subsequent layer is smaller than the composition parameter (1-xg) of the layer having a gradient composition.

Advantageously, compound A is silicon or germanium, compound B is silicon or germanium and is different from compound A, and the substrate is silicon or germanium. Also, an additional layer of strained silicon can be provided over the stack. These laminated structures are typically used in or as integrated circuits.

BRIEF DESCRIPTION OF THE DRAWINGS

Additional advantageous embodiments of the invention will be described in the following with respect to the drawing figures, wherein:

FIG. 3 illustrates a third embodiment of the laminated layer structure according to the invention wherein the first layer has a gradient composition.

DETAILED DESCRIPTION OF THE PREFERRED EMBODIMENTS

Figure 1:
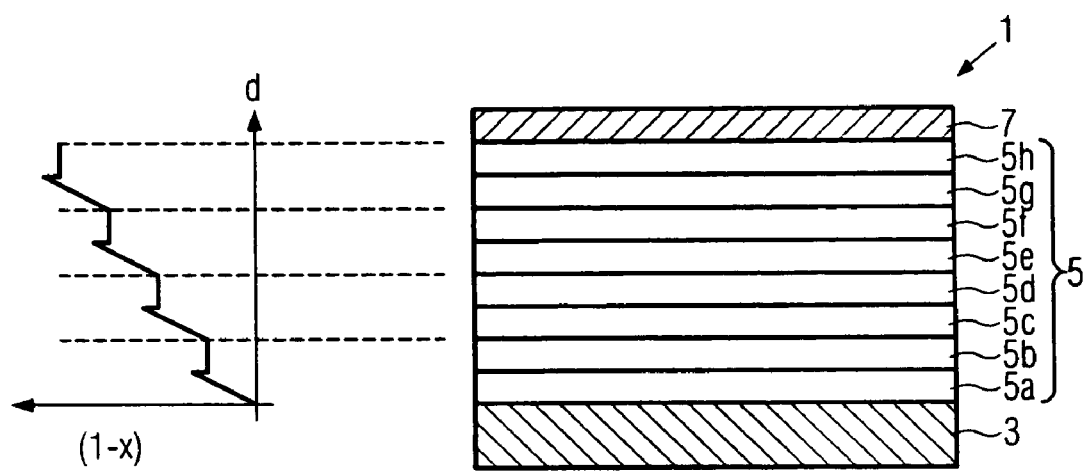
FIG. 1 illustrates a first embodiment of a laminated layer structure according to the invention as well as the dependence of the fraction of compound B as a function of the thickness of the overall stack of layers.

During epitaxial growth of a heterogeneous material $A_xB_{1-x}$ where x is between 0 and 1, essentially two phenomena occur, namely the creation of stress, as long as the layer is relatively thin and its lattice parameter undergoes a deformation to match that of the underlying layer, and the creation of defects, such as dislocations, when the thickness of a layer becomes greater than a certain minimum thickness. The same effects occur during the epitaxial growth of the first layer on the substrate, which usually is a crystalline material. In the case a layer of the binary material is grown with a gradient composition, in which the proportion of one element increases as the proportion of the other decreases, the stress inside the layer is reduced due to a controlled rate of dislocation generation, however, the layer at the end of the gradient still shows stress, but is free of dislocations.

It has now been found that when stepping back in the composition, thus reducing the content of compound B in the material, the negative effect of the stress of the end layer of the layer with the gradient composition is surprisingly reduced at the interface between a layer with a gradient composition and the subsequent layer. In fact, the change in composition allows the crystalline structure of the subsequent layer to reorganize under improved conditions, namely with no stress added and no more generation of dislocations. This effect can be observed over the entire stack and finally leads to a laminated structure having a reduced dislocation density and improved surface roughness as compared with the one obtained by the state of the art laminated layer structures.

The stack comprises as many layers as necessary to achieve the desired fraction of compound B in the material comprising the at least two compounds $A_xB_{1-x}$.

The term "subsequent" in this context means that the subsequent layer is further away from the substrate than the previous layer of a gradient composition and the term "compound" is not limited to one single chemical element, but could be a combination or a plurality of elements.

Preferably, in the stack the layers with the gradient composition are alternately arranged with layers of a constant composition for which the composition parameter $(1-x_c)$ is a constant. In this case the layers of constant composition thus have a fraction of compound B in the material that is lower than the one at the end of the previous layer of gradient composition. The layer of constant composition benefits from the fact that its crystalline structure can reorganize under improved conditions so that dislocations still present can recombine and evacuate without additional creation of stress. Thus an even further improved laminated layer structure can be achieved.

According to an advantageous embodiment, the composition parameter $(1-x_c)$ at the interface between the layer in the stack with a constant composition and the subsequent layer with a gradient composition can be essentially the same as the composition parameter $(1-x_g)$ of the layer with the gradient composition. Thus the fraction of compound B in the material $A_xB_{1-x}$ can quickly increase in the stack until the desired level at the end of the stack, as at those interfaces no step back in composition is necessary to keep the crystalline quality high. Thus the number of layers to achieve the desired fraction of compound B can be kept low, and this keeps manufacturing costs low.

Advantageously, the composition parameters satisfy the relation $0.001 \leq (1-x_g)-(1-x_s) \leq 0.07$, in particular $0.005 \leq (1-x_g)-(1-x_s) \leq 0.05$, at the interface between the layer in the stack with a gradient composition and a subsequent layer. For such a step back in composition, a composition level in the subsequent layer is obtained for which the residual stress in the gradient layers is essentially negligible. If the change in composition is smaller than this value, some residual stress may persist in the subsequent layer leading to a negative impact on its crystalline quality, whereas in the case a step back in composition is chosen which is larger than the above range, it will take longer to achieve the final layer with the desired composition, leading to a thicker laminate structure and/or a more expensive manufacturing.

According to a preferred embodiment, the first layer provided on the substrate can be a layer with a constant composition with the corresponding composition parameter $(1-x_c)$ being in a range of about 0.01 to 0.09, in particular in the range of 0.05 to 0.06 or a layer with a gradient composition having the corresponding composition parameter $(1-x_g)$ at the interface with the substrate (3) being in a range of about 0.01 to 0.09, in particular in a range of 0.05 to 0.06. In this composition range, the change in lattice parameters compared to the substrate is small, thus the impact on crystalline quality of the first layer is still low and its influence on the quality of the final layer of the stack is low or even absent. In addition the number of layers in the stack can be kept low as one can omit a first layer with a gradient composition starting from $x=1$ $(1-x=0)$.

Advantageously at each of the interfaces at which the composition parameter of the subsequent layer is smaller than the one of the previous layer, the difference in the corresponding composition parameters $(1-x_g)-(1-x_s)$ can be essentially constant. As long as the step back in the composition parameter is sufficient to continue the growth of the stack such that the reorganization of the following layer is achieved without generating new stress, it is preferable to grow the structure with a constant step back, as this facilitates the control of the growth process parameters.

According to a preferred embodiment, the difference in composition parameters $(1-x_g)-(1-x_s)$ can be increasing from one interface at which the composition parameter of the subsequent layer is smaller than the one of the previous layer to the subsequent interface at which the composition parameter of the subsequent layer is smaller than the one of the previous layer starting from the substrate. As a variant the difference in composition parameters $(1-x_g)-(1-x_s)$ could be decreasing from one interface to the next one. The change in the magnitude of the step back of the composition parameter can be advantageous in the case that due to the material characteristics the composition level in the layer with gradient composition for which no stress is observed changes as a function of the composition of the material itself. Thus the laminated layer structure can be further optimized by adapting the step back magnitude.

According to a preferred embodiment, compound A can be one of silicon or germanium and compound B can be the other and/or the substrate can be one of a silicon or a germanium substrate. These materials are particularly interesting for the cited laminated layer structure, not only as they are commonly used in the electronics industry and thus are easily available, but also as with these materials laminated layer structures with a surface roughness smaller or equal than 15 Å RMS and with a dislocation density of equal to or less than $10^5$ cm$^{-2}$, in particular of less than $10^4$ or even $10^3$ cm$^{-2}$, can be achieved while at the same time the dislocation pile up density can be kept at a level of less or equal than 20 cm$^{-1}$. Thus, laminated layer structures with a crystalline quality of the final layer being significantly better than the one of the prior art can be achieved.

According to a preferred embodiment, an additional layer, in particular a strained silicon layer, is provided over the stack. Especially in combination with the materials cited above, a strained silicon layer can be achieved being of improved crystalline quality compared to the one obtained in the state of the art.

Advantageously the final layer of the stack is a layer of constant composition with a corresponding composition parameter $(1-x_c) \geq 0.2$, in particular $(1-x_c) \geq 0.4$. As with the laminated layer structure according to the invention the dislocation density and surface roughness can be kept small, as quantified above, and then it becomes possible to provide a laminated layer structure wherein the final layer has a high fraction of compound B, but which still satisfies the requirements of low dislocation density and low surface roughness.

Advantageously, the final layer of the stack can be a layer of constant composition with a thickness within a range of about 50 nm to 5 µm, in particular within a range of about 0.9 µm to 5 µm. This last layer plays the role of a relaxation layer and due to the improved properties, with respect to stress and dislocations, of the underlying layers, it can be grown relatively thick while keeping the desired lattice parameters constant, so that it can serve as a substrate for the subsequent deposition of strained silicon.

According to a preferred embodiment, the material can comprise a third compound $C_y$ to create a compound $A_x C_y B_{(1-x-y)}$, with y being a second composition parameter that is within the range of $0 \leq y \leq 1$, wherein at least a part of the layers of the stack has a gradient composition $A_{xg} C_{yg} B_{(1-xg-yg)}$, with the composition parameter $(1-x_g-y_g)$ increasing and the composition parameter $y_g$ decreasing gradually, in particular linearly, over the thickness of the corresponding layer. Also, at the interface between a layer in the stack having the gradient composition and the subsequent layer in the stack, the composition parameter $(1-x_s-y_s)$ of the subsequent layer is smaller than the composition parameter $(1-x_g-y_g)$ of the layer with the gradient composition and the composition parameter $y_s$ of the subsequent layer is larger than the composition parameter $y_g$ of the layer having the gradient composition. In this kind of material, both the composition of compound B and C can vary. This has the advantage that the change in lattice parameters can be further fine tuned to reduce stress and dislocation densities. The step back can be achieved in particular by decreasing the parameter $(1-x-y)$ and/or increasing the parameter y.

Preferably, compound C can be carbon. In particular in combination with Si and Ge a high quality SiGe compound can be formed starting from a substrate of Si. It is the purpose of the graded layer to gradually increase the lattice parameter. In the material with three compounds, this can be achieved by increasing the Ge fraction and/or reducing the carbon fraction. The step back can then be achieved by decreasing the Ge fraction at the interface and/or increasing the carbon fraction.

The invention also relates to integrated circuits comprising a laminated layer structure like the types described above. In particular, in the combination with strained silicon on top of the laminated layer structure, integrated circuits of high speed can be fabricated with high production yields using the laminated layer structures according to the invention.

The change in composition at the interfaces between a layer of gradient composition and a subsequent layer allows the crystalline structure of the subsequent layer to reorganize under improved conditions during its growth, namely with less stress and dislocations. This effect can be observed over the entire stack and finally leads to a laminated structure with a reduced dislocation density and improved surface roughness as compared with the one obtained by the state of the art laminated layer structures.

Preferably the subsequent layer in step c) can be grown with a constant composition $(1-x_c)$. During growth, the crystalline structure can reorganize under improved conditions so that dislocations still present can recombine and evacuate without an additional creation of stress.

Advantageously at the interface between the layer in the stack with the constant composition and the subsequent layer with a gradient composition, the layers can be grown such that the composition parameter $(1-x_c)$ is essentially the same as the composition parameter $(1-x_g)$ of the layer with a gradient composition. Thus the fraction of compound B in the material $A_x B_{1-x}$ can quickly increase in the stack until the desired level at the end of the stack. As a consequence, the number of layers to achieve the desired fraction of compound B can be kept low, thereby keeping manufacturing costs low.

According to a preferred embodiment, the interface between the layer with a gradient composition and the subsequent layer, the layer with the gradient composition and the subsequent layer can be grown such that the composition parameters satisfy the relation $0.001 \leq (1-x_g)-(1-x_s) \leq 0.07$, in particular $0.005 \leq (1-x_g)-(1-x_s) \leq 0.05$. In this range, the advantageous effects of stress and dislocation density reduction are achieved during the growth of the layers whereas at the same time the increase in the fraction of compound B is still large enough to obtain a satisfactory manufacturing throughput.

Preferably, prior to step b) a first layer of constant composition can be grown with the corresponding composition parameter $(1-x_c)$ being in a range of about 0.03 to 0.09, in particular in a range of 0.05 to 0.06. To realize layers of lower fractions of compound B, which would be necessary to grow a layer of gradient composition starting with the composition parameter x=1, it would be necessary to control precisely the amount of compound B when growing the layer. When growing such a layer, it is, however, difficult to control very small material composition percentages, so that in the first layer relatively large variations could occur. As for the first layer, a small step in the concentration does not effect the quality of the final layers of the stack, the first layer of the stack can be chosen to be one of a constant composition.

According to a variant, the first layer of gradient composition provided on the substrate (3) can be grown with a composition parameter $(1-x_g)$ at the interface with the substrate (3) being in a range of about 0.01 to 0.09, in particular in a range of 0.05 to 0.06. As for the first layer a small step in the concentration does not effect the quality of the final layers of the stack, the first layer of the stack, in the case it is a layer with a gradient composition, it is not necessary to start with a composition parameter $(1-x)=0$ at the interface. Thus the desired composition in the final layer of the stack can be achieved more quickly.

Advantageously the layers of gradient composition and the subsequent layers can be provided such that the difference in composition parameters $(1-x_c)-(1-x_s)$ is constant for each interface at which the composition parameters of the subsequent layer is lower than the one of the previous layer. Keeping the step back in composition constant facilitates the control of the growth parameters.

According to a variant the layers of gradient composition in the subsequent layers can be provided such that the difference in composition parameters $(1-x_g)-(1-x_s)$ is increasing or decreasing from one interface at which the composition parameter of the subsequent layer is lower than the one of the previous layer to the subsequent interface at which the composition parameter of the subsequent layer is lower than the one of the previous layer starting from the substrate. Depending on the material characteristics of compounds A and B, the surface roughness and dislocation density properties can be further optimized by adapting the step back accordingly for each interface.

According to a preferred embodiment, the layers can be grown with a deposition method, in particular a chemical vapor deposition method (CVD), and wherein at the interface between the layer with the gradient composition and the subsequent layer, the decrease in the composition parameter (1-x) can be achieved by changing only one of the growth parameters, in particular the flow rate of one of the precursor gases used to deposit the compounds A and B. By changing only one growth parameter, the desired profile in the composition parameter can be achieved in a simple and reproducible manner.

According to a variant in step b), a layer of a material comprising three compounds $A_x$, $C_y$ and $B_{(1-x-y)}$ can be grown with a gradient composition $A_x C_{yg} B_{(1-xg-yg)}$, such that the composition parameter (1-xg-yg) gradually increases and the composition parameter $y_g$ decreases, in particular linearly, over the thickness of the layer, in step c) a subsequent layer of a compound $A_{xs} C_{ys} B_{(1-xs-ys)}$ can be grown on the layer of with the gradient composition $A_x C_{yg} B_{(1-xg-yg)}$, and at an interface between a layer with a gradient composition and a subsequent layer the growth parameters are chosen such that the composition parameter (1-xs-ys) of the subsequent layer is smaller than the composition parameter (1-xg-yg) of the layer with a gradient composition and the composition parameter $y_s$ of the subsequent layer is larger than the composition parameter $y_g$ of the layer with a gradient composition. Using a third compound the change in lattice parameters can be further fine tuned, leading to reduced stress and dislocation densities.

FIG. 1 illustrates a first embodiment of a laminated layer structure 1 according to the present invention. A laminate 1 comprises a substrate 3 and a stack 5 of a plurality of layers. In addition, an additional layer 7, in particular a strained silicon layer, is epitaxially grown on the top of the stack 5. Further buffer layers could be provided in between the stack 5 and the additional layer 7, if desired.

Substrate 3 is a typical semiconductor wafer, like for example a silicon or germanium wafer having a predetermined crystalline structure.

The stack 5 of the plurality of layers comprises layers of a material $A_x B_{(1-x)}$. In particular, compound A is silicon or germanium and compound B is the other one of silicon and germanium. x and (1-x) are composition parameters describing the fractions of compound A and compound B respectively in the material $A_x B_{(1-x)}$.

The substrate material is chosen such that an epitaxial growth of compound A on the substrate 3 is possible. Preferably compound A and the substrate 3 have the same lattice parameter to allow homoepitaxial growth. The second compound B is chosen such that the material $A_x B_{(1-x)}$ has a slightly different lattice parameter with respect to substrate A wherein the difference increases with an increasing amount of compound B in the material $A_x B_{(1-x)}$.

In the following the invention will be illustrated using silicon as a substrate material and $Si_x Ge_{1-x}$ as the stack material, forming a binary material. However, it should be noted that other material combinations, such as using germanium as a starting substrate, also fall under the invention.

On the left side of the laminated layer structure 1 illustrated in FIG. 1 is shown the variation of the composition parameter (1-x) as a function of the thickness of the stack 5 of the plurality of layers.

The first layer 5a of the stack 5 has a gradient composition. That is, the composition parameter 1-x is increases gradually over the thickness of the first layer 5a. In this embodiment, the increase is linear. The composition parameter $(1-x_g)$ starts at a value of 0, thus at the interface between the substrate 3 and the first layer 5a have the same composition $Si_1 Ge_0$, thus the same lattice parameter and reaches a predetermined value at the interface to the subsequent layer 5b.

The subsequent second layer 5b in the stack 5 has a constant composition over its entire thickness and the corresponding composition parameter $(1-x_c)$ is smaller than the composition parameter $(1-x_g)$ at the interface towards the underlying first layer 5a with the gradient composition. The subsequent third layer 5c in the stack 5 is again a layer with a gradient composition, wherein at the interface towards the second layer 5b the composition parameters $(1-x_g)$ and $(1-x_c)$ of both layers 5b and 5c are the same. The fourth layer 5d is then again a layer of constant composition comparable to layer 5b, with a larger fraction of compound B, but again the composition parameter $(1-x_c)$ at the interface towards the third layer is smaller than the composition parameter $(1-x_g)$ of the third layer 5c at this interface. The alternating layer structure is then repeated again, in this embodiment a total of four times. However, the number of bi-layers, constituted by a layer of gradient composition and a layer of constant composition is not limited to the number of four, but could also be out of the range of one to ten, in particular three or four.

As can be seen from FIG. 1, the composition parameter $(1-x_c)$ is increasing from one layer of constant composition to the next one. According to one variant the plateaus are at 5%, 10%, 15% and 20% for the last layer 5h, so that the composition of the binary material in layer 5h in this example is equal to $Si_{0.8} Ge_{0.2}$. Of course the increase from one plateau to the next one does not necessarily have to be regular or uniform and the value of (1-x)=0.2 also only corresponds to one possibility for the final composition of the binary material. Indeed, germanium compositions of 0.40% or even more can be achieved, as desired.

The layers of the stack 5 have a thickness within a range of about 20 nm to 1 μm, in particular within a range of about 50 nm to about 500 nm. The last layer of the stack 5h may even have thickness of up to 5 μm to play the role of a buffer layer for the strained silicon layer 7. It is not necessary that each layer have the same thickness. The same is valid for the slope of the composition parameter in the layers with the gradient composition 5a, 5c, 5e, 5g. In this first embodiment the slope is constant for each layer of the gradient composition 5a, 5c, 5e, 5g, but it could also be different for each layer. In addition, the increase could also be of any other form, like e.g., a parabolic increase. For a linear gradient, the slope for the composition parameter (1-x) should be less than about 0.25 Ge %/μm.

The step back in the composition at the interfaces between a layer of gradient composition 5a, 5c, 5e, 5g and the subsequent layer of constant composition 5b, 5d, 5f, 5h plays an important role. Due to the presence of these step backs the dislocation density and the surface roughness of the layers in the stack 5, in particular in the last layer 5h of the stack 5 can be reduced in comparison with stacks at which no step back is provided.

Actually, the epitaxial growth of a layer having a misfit in crystalline structure with respect to an underlying substrate leads to the creation of stress inside the epitaxial layer when the thickness of the epitaxial layer is small. In fact, the crystalline structure of the deposited layer adapts its lattice parameters to the one of the underlying substrate. Once the thickness of the layer becomes larger than a critical thickness, the lattice parameter of the deposited layer progressively will find back its natural lattice parameter. This phenomenon is accompanied by the creation of dislocations and a relaxation of the stress in the deposited layer. Due to the presence of the dislocations the crystalline quality is limited and, in addition, the surface roughness becomes negatively affected.

When trying to reduce the dislocation density as well as the surface roughness, the provision of a layer with gradient composition on the substrate can keep the dislocation density relatively low, however, in the final layers of the layer with the gradient composition a residual stress is present. It has therefore been proposed to alter layers with a gradient and layers with constant composition wherein the composition of the layer with constant composition corresponds to the one of the interface with the gradient layer. This arrangement helps in reducing the negative effects, however, a certain amount of stress remains so that dislocation reduction and surface roughness are still not sufficient.

The inventors of the present invention have identified that dislocation density and surface roughness can further be improved by providing the step back in composition, wherein the layer of constant composition has a composition that corresponds to such a composition for which in the layer of gradient composition no stress or a reduced stress level can be observed. Thus the step back in composition allows the crystalline structure of the layer to reorganize without generating new dislocations and at the same time the new epitaxial layer is relaxed.

Best results with respect to dislocation density and surface roughness have been achieved for step backs in composition which are of the order of $0.001 \leq (1-x_g)-(1-x_c) \leq 0.07$, in particular $0.005 \leq (1-x_g)-(1-x_c) \leq 0.05$, wherein $(1-x_g)$ is the composition parameter at the interface of the layer with a gradient composition and $(1-x_c)$ the composition parameter at the interface of the layer of constant composition. Thus, for these step backs layers with a reduced stress level can be grown.

According to variants, the step back in composition at each interface of the layer with gradient composition $5a$, $5c$, $5e$, $5g$ and the subsequent layer $5b$, $5d$, $5f$, $5h$ of constant composition can be constant, can increase from one interface to the following one starting from the substrate $3$ or decrease from one interface to the next one starting from the substrate $3$.

With the laminated layer structure $1$ according to the first embodiment dislocation densities of less than $10^5$ cm$^{-2}$ and a dislocation pile up density of less than $20$ cm$^{-1}$ can be achieved, while at the same time the surface roughness is less than $15$ Å RMS on the surface of the final layer $5h$ of the stack $5$.

The laminated layer structure $1$ can be fabricated in the following way. In a first step, a silicon wafer is provided as a substrate $3$ after having been cleaned, for example with HF to remove the native oxide on its surface. Then the layers $5a$, ..., $5h$ of the stack $5$ are epitaxially grown by a deposition method, in particular a chemical vapor deposition method (CVD). Other epitaxial growth methods like plasma enhanced CVD (PECVD), molecular beam epitaxy (MBE) or physical vapor deposition (PVD) techniques may also be used. The silicon substrate $3$ is brought into a reactor chamber of a CVD apparatus where another step to remove the oxide using H$_2$ may take place at a temperature between $950°$ C. and $1150°$ C. or when the wafer has been previously cleaned by HF under a temperature of about $800°$ C. to $1000°$ C.

The temperature of the reactor chamber is then adjusted to the deposition temperature that depends on the precursor gases chosen for the deposition. For silicon germanium films suitable precursor gases are SiH$_4$, DCS or TCS and GeH$_4$, GeH$_3$Cl, GeH$_2$Cl$_2$, GeHCl$_3$ or CeCl$_4$ together with H$_2$ as a carrier gas.

By starting the introduction of the precursor gases into the reactor chamber the growth of the layers of the stack $5$ is initiated. The ratio of silicon with respect to germanium in the precursor gases at a given hydrogen flux determines the composition of the deposited Si$_x$Ge$_{1-x}$ layer. At the same time the composition of the binary material is also a function of pressure, which is usually in between $20$ Torr ($2.66$ kPa) to about atmospheric pressure, and the temperature, which is typically in a range of $500°$ C. to $1100°$ C. To obtain the gradient composition for layers $5a$, $5c$, $5e$ and $5g$ the flux of the precursor gases is continuously modified which results in a continuous modification of the composition of the deposited layer. Eventually the composition can also be influenced by modifying the temperature. During growth the susceptor carrying the substrate $3$ is preferably rotated at a velocity inferior to $1000$ tr/min.

To obtain the layers of constant composition $5b$, $5d$, $5f$ and $5h$ the growth parameters in the reactor chamber are fixed and the desired thickness of the deposited layer is achieved by choosing the deposition time period accordingly. To get the step back in composition at the interface between a layer of a gradient composition $5a$, $5c$, $5e$, $5g$ and a subsequent layer of a constant composition $5b$, $5d$, $5f$, $5h$, one of the growth parameters is changed, preferably the flux of one of the precursor gases, in this embodiment the flux of the germanium precursor gas.

After the growth of a layer of constant composition $5b$, $5d$, $5f$, the subsequent layer $5c$, $5e$, $5g$ of gradient composition is grown in the same way as previously described, wherein the growth parameters are chosen such that the starting composition corresponds to the composition of the layer of the constant composition $5b$, $5d$, $5f$.

The alternating deposition of a layer of the gradient composition $5a$, $5c$, $5e$, $5g$ and a layer of constant composition $5b$, $5d$, $5f$ and $5h$ with the step back is repeated four times to achieve a last layer in the stack $5h$ with the desired fraction germanium in the Si$_x$Ge$_{1-x}$ composition such that the subsequently deposited additional layer $7$, here a strained silicon layer, has the desired lattice parameters to allow the creation of high-speed electronic devices.

With the above-described process a Si$_x$Ge$_{(1-x)}$ laminated layer structure with a germanium fraction of $20\%$ in the final layer of the stack has been achieved with a surface roughness of less than $15$ Å RMS, a pile up density of less than $20$ cm$^{-1}$ and a dislocation density of less than $10^4$ cm$^{-2}$.

Instead of a binary material it is also possible to build up the stack of layers with a material comprising three different elements, like for example Si$_x$Ge$_{(1-x-y)}$C$_y$. In this embodiment the growing lattice parameter can be achieved by reducing the fraction of carbon and/or by increasing the amount of Ge. The step back in composition at the interface between a layer of gradient composition and a layer of constant composition can then be achieved by increasing the amount of carbon and/or by decreasing the fraction of Ge. For this embodiment surface roughness values, pile up density values and dislocation densities have been observed which are similar to the binary material stack SiGe.

Figure 2:
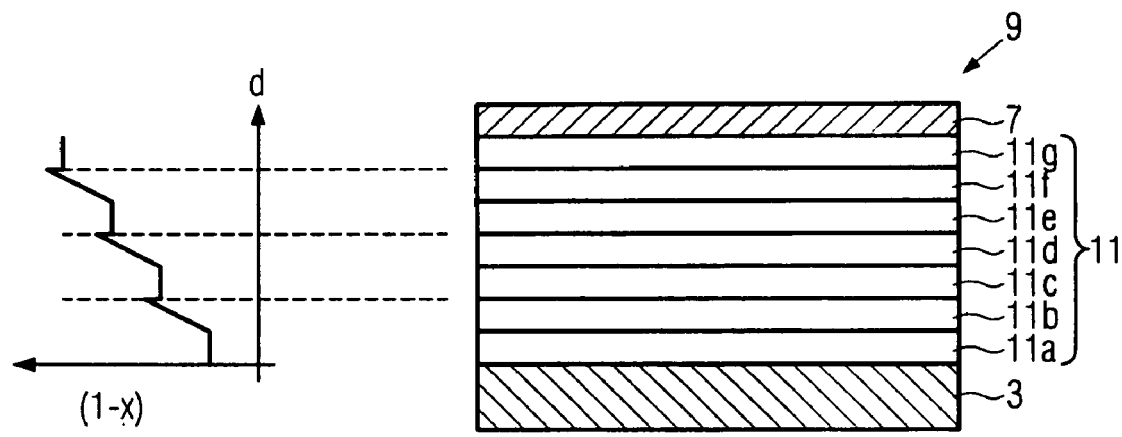
FIG. 2 illustrates a second embodiment of the laminated layer structure according to the invention wherein the first layer of the stack has a constant composition.

FIG. 2 displays a second embodiment of a laminated layer structure 9 according to the invention. The only difference with respect to the laminated layer structure according to the first embodiment illustrated in FIG. 1 is that the stack 11 has one layer less than stack 5 of embodiment 1. Comparable layers, in particular the substrate and the additional layer, between the first and the second embodiment share the same properties and features. Their description is omitted here, but incorporated herewith by reference to the description of FIG. 1. This is also valid with respect to the method of fabricating the laminated layer structure 9 according to the second embodiment. In the second embodiment the first layer 11a of the stack 11 on the substrate 3 is not a layer of a gradient composition like in the first embodiment, but a layer of a constant composition. This is advantageous as actually starting with a very low percentage of germanium in the first layer 11a on the silicon substrate 3 is not that easy to realize, as the mass flow control for the precursor gas for germanium is difficult to realize when operating with very small mass flows. As a consequence, if the first layer has a gradient composition, the introduced error in the composition of the binary material is percentage wise relatively high compared to layers where the germanium percentage is high. It has, however, been observed that when the first layer 11a of the stack is a layer of constant composition, in particular a $Si_xGe_{1-xc}$ layer with the composition parameter (1-xc) being in the range of about 1-9% (i.e., 0.01 to 0.09), in particular in a range of about 5-6% (i.e., between 0.05 and 0.06), a layer can be achieved the quality of which with respect to dislocation and surface roughness is sufficiently good or even better than in the case of a gradient composition layer with large errors, so that in the end a strained silicon layer 7 is achieved which is comparable or even better than the one compared to the first embodiment. In addition, due to the fact that the amount of layers in the stack 11 is reduced compare to the first embodiment, while at the same time the same germanium fraction in the last layer 11g and 5h respectively is obtained, the throughput for fabricating such laminated layer structures is higher in the case of the second embodiment. Thus the laminated layer structure 9 can be produced cheaper.

FIG. 3. displays a third embodiment of a laminated layer structure 13 according to the invention. The difference with respect to the laminated layer structure according to the first embodiment illustrated in FIG. 1 is that the stack 15 has a first layer 15a with a gradient composition parameter $(1-x_g)$ at the interface with the substrate 3 that is different from zero, in particular $(1-x_g)$ is in the range of about 1-9%, in particular in a range of about 5-6%. Thus like in the second embodiment the final composition can be achieved with less deposited layers, leading to a higher fabrication throughput. Indeed, compared to the first embodiment the final, desired composition is achieved with three gradient layers only. Comparable layers, in particular the substrate and the additional layer, between the first and the second embodiment share, however, the same properties and features like the first embodiment. Their description of the features and properties of the further layers of the third embodiment is omitted here, as they are comparable to the ones of the first embodiment and are therefore incorporated herewith by reference to the description of FIG. 1. This is also valid with respect to the method of fabricating the laminated layer structure 13 according to the third embodiment.

What is claimed is:

1. A method for forming a laminated layer structure that comprises:
   providing a substrate,
   growing a layer of a material comprising at least two compounds $A_x$ and $B_{(1-x)}$ with a gradient composition $A_{xg}B_{(1-xg)}$, such that the composition parameter (1-xg) gradually increases over the thickness of the layer,
   growing a subsequent layer of a material $A_{xs}B_{(1-xs)}$ on the layer of a material $A_xB_{(1-x)}$ having a gradient composition $A_{xg}B_{(1-xg)}$, and
   repeating the two preceding steps one or more times to build a stack of layers of the material $A_xB_{(1-x)}$,
   wherein compound A has a lattice parameter being sufficient to allow homo- or heteroepitaxial growth of compound A on the substrate, and
   wherein x is a composition parameter that is above 0 to less than 1 (o<x<1),
   choosing growth parameters at an interface between a layer having a gradient composition and a subsequent layer such that the composition parameter (1-xs) of the subsequent layer is smaller than the composition parameter (1-xg) of the layer having a gradient composition.

2. The method according to claim 1, wherein the layers in the stack that have the gradient composition alternate with layers having a constant composition (1-xc).

3. The method according to claim 2, wherein at the interface between a layer in the stack with a constant composition and the subsequent layer having a gradient composition the layers are provided such that the composition parameter (1-xc) of the layer having the constant composition is essentially the same as the composition parameter (1-xg) of the layer having the gradient composition.

4. The method according to claim 1, wherein at the interface between the layer having a gradient composition and the subsequent layer, the layer having the gradient composition and the subsequent layer are grown such that the composition parameters satisfy the relation $0.001 \leq (1-xg)-(1-xs) \leq 0.07$.

5. The method according to claim 1, wherein prior to the second step a first layer of constant composition is grown with a corresponding composition parameter (1-xc) being in the range of 0.01 to 0.09.

6. The method according to claim 1, wherein the first layer of gradient composition provided on the substrate is grown with a composition parameter (1-xg) at the interface with the substrate being in a range of about 0.01 to 0.09.

7. The method according to claim 1, wherein the layers of gradient composition and the subsequent layers are provided such that the difference in composition parameters (1-xg)-(1-xs) is constant for each interface at which the composition parameter of the subsequent layer is smaller than the composition parameter of the previous layer.

8. The method according to claim 1, wherein the layers of gradient composition and the corresponding subsequent layers are provided such that the difference in composition parameters (1-xg)-(1-xs) increases from one interface at which the composition parameter of the subsequent layer is smaller than the one of the previous layer to the subsequent interface at which the composition parameter of the subsequent layer is smaller than the one of the previous layer starting from the substrate.

9. The method according to claim 1, wherein the layers are grown with a deposition method and wherein at the interface between a layer having a gradient composition and a subsequent layer, the decrease in the composition parameter (1-x) is achieved by changing only one of the growth parameters.

10. The method according to claim 1, wherein in the second step a layer of a material comprising three compounds $A_xC_yB_{(1-x-y)}$ is grown with a gradient composition $A_xC_{yg}B_{(1-xg-yg)}$, such that the composition parameter (1-xg-yg) gradually increases over the thickness of the layer, wherein in a subsequent layer of a compound $A_{xs}C_{ys}B_{(1-xs-ys)}$ is grown on the layer of the gradient composition $A_xC_{yg}B_{(1-xg-yg)}$, and wherein at an interface between a layer having a gradient composition and a subsequent layer, the growth parameters are chosen such that the composition parameter (1-xs-ys) of the subsequent layer is smaller than the composition parameter (1-xg-yg) of the layer having the gradient composition and the composition parameter ys of the subsequent layer is larger than the composition parameter yg of the layer having the gradient composition.

11. The method according to claim 10, wherein the composition parameter (1-xg-yg) increasing linearly and the composition parameter yg decreasing linearly over the thickness of the corresponding layer, and compound C is carbon.

12. The method according to claim 1, which further comprises conducting a homo- or heteroepitaxial growth of compound A on the substrate.

13. The method according to claim 1, wherein at least a part of the stack of layers has a gradient composition $A_{xg}B_{(1-xg)}$, with xg being a composition parameter of A that is within the range of $0 \leq x \leq 1$, and with (1-xg) being a composition parameter of B that increases gradually over the thickness of that part of the layer, and wherein a subsequent layer in the stack positioned adjacent the part of the stack having gradient composition $A_{xg}B_{(1-xg)}$ has a composition of $A_{xs}B_{(1-xs)}$ with xs being a composition parameter of A and (1-xs) being a composition parameter of B wherein the parameter (1-xs) is smaller than the parameter (1-xg).

14. The method according to claim 13, wherein the layers in the stack that have the gradient composition alternate with layers having a constant composition (1-xc).

15. The method according to claim 1, wherein compound A is silicon or germanium, compound B is silicon or germanium and is different from compound A, and the substrate is silicon or germanium.

16. The method according to claim 1, wherein an additional layer is provided over the stack, with the additional layer comprising a strained silicon layer.

17. The method according to claim 1, wherein the final layer of the stack is a layer of constant composition with a corresponding composition parameter (1-xc) that is greater than or equal to 0.2 or that is greater than or equal to 0.4.

18. The method according to claim 1, wherein the final layer of the stack is a layer of constant composition with a thickness of about 50 nm to 5 µm.

19. The method according to claim 1, which further comprises providing an integrated circuit on the laminated layer structure.

20. The method according to claim 1 wherein the two preceding steps are repeated between three or four to ten times to build the stack of layers.

* * * * *

UNITED STATES PATENT AND TRADEMARK OFFICE
CERTIFICATE OF CORRECTION

PATENT NO. : 7,387,953 B2
APPLICATION NO. : 11/146572
DATED : June 17, 2008
INVENTOR(S) : Figuet It is certified that error appears in the above-identified patent and that said Letters Patent is hereby corrected as shown below:

Drawings:
Replace Figs. 1-2 with the following Figs. 1-3.

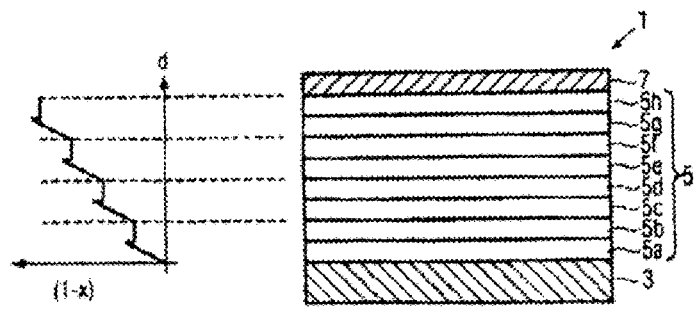

FIG. 1

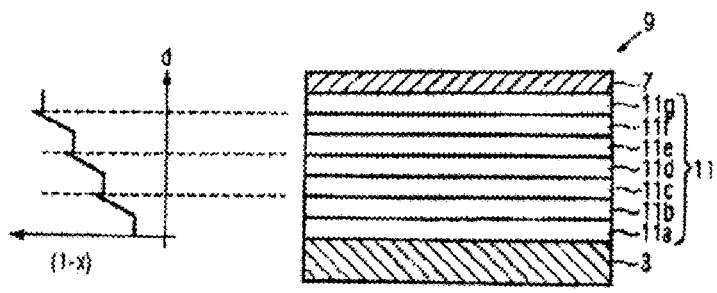

FIG. 2

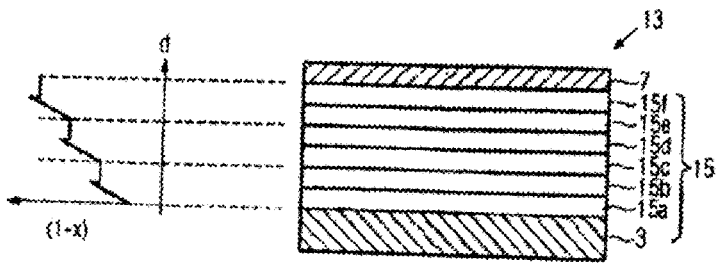

FIG. 3

UNITED STATES PATENT AND TRADEMARK OFFICE
CERTIFICATE OF CORRECTION

PATENT NO. : 7,387,953 B2
APPLICATION NO. : 11/146572
DATED : June 17, 2008
INVENTOR(S) : Figuet It is certified that error appears in the above-identified patent and that said Letters Patent is hereby corrected as shown below:

Column 8:
Line 6, before "increases", delete "is".
Line 10, change "Sa" to -- 5a --.

Signed and Sealed this

Nineteenth Day of August, 2008

JON W. DUDAS
*Director of the United States Patent and Trademark Office*